United States Patent [19]
Walden

[11] Patent Number: 5,126,889
[45] Date of Patent: Jun. 30, 1992

[54] TECHNIQUE FOR INFORMATION PROTECTION ON FAULT-TOLERANT REDUNDANT INFORMATION STORAGE DEVICES

[75] Inventor: John S. Walden, Green Brook, N.J.

[73] Assignee: AT&T Bell Laboratories, Murray Hill, N.J.

[21] Appl. No.: 440,631

[22] Filed: Nov. 22, 1989

[51] Int. Cl.$^5$ .......................... G11B 5/09; G06F 15/40
[52] U.S. Cl. ...................................... 360/53; 371/68.3
[58] Field of Search .............................. 360/47, 48, 53; 371/68.3, 11.1, 11.3, 68.1

[56] References Cited

U.S. PATENT DOCUMENTS 4,772,963 9/1988 Van Lahr et al. .................... 360/47

OTHER PUBLICATIONS

"An Example of Microprocessor's Application in Minicomputer Systems: a Copy Volume Design and Implementation" Microprocessing and Microprogramming, 1984. pp. 331–339.
Hendrie, *Electronics*, vol. 56, No. 2, Jan. 27, 1983, pp. 103–105.
Brusamolino et al., *Microprocessing & Microprogramming*. vol. 13, No. 5, May 1984, pp. 331–339.
Kavanagh, *Management Review (GB)*, Sep. 1984, pp. 22–23.

*Primary Examiner*—Aristotelis Psitos
*Assistant Examiner*—Won Tae C. Kim
*Attorney, Agent, or Firm*—F. Luludis

[57] ABSTRACT

The present invention relates to a technique which provides swift and easy error correction and detection on one or more fault-tolerant redundant storage devices. In the presence technique, an information packet including (a) the destined storage location identifier in a first section, (b) the information in a second section, and (c) a unique monotonically increasing number in a third section, is sent by a processor to one or more redundant storage device controllers for storage in relative locations of the redundant storage device(s), where the monotonically increasing number is incremented and applied to each sequential information packet to be stored on the redundant storage device(s). When relative storage locations of the redundant storage device(s) are subsequently read and the information is found not to match, an error has occurred on one of the storage device(s), and if the storage location identifier on the compared information packets are also found not to match, then the information packet including the correct storage location identifier is used. However, if the storage location identifiers are found to match, then the compared information packet with the higher monotonically increasing number is deemed to contain the correct information.

6 Claims, 2 Drawing Sheets

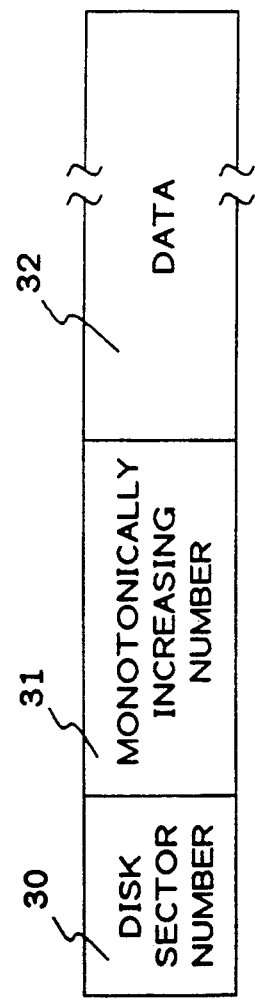

TECHNIQUE FOR INFORMATION PROTECTION ON FAULT-TOLERANT REDUNDANT INFORMATION STORAGE DEVICES

TECHNICAL FIELD

The present invention relates to a technique for the protection of information on one or more fault-tolerant redundant information storage devices that permits detection of which information is correct after associated one or more redundant device controllers write information into non-relative storage locations of the redundant storage device(s).

DESCRIPTION OF THE PRIOR ART

Fault-tolerant disk systems use redundancy, or duplication, of data storage on mirrored disks to protect loss of data in case of equipment failure. Examples of such system are disclosed in the articles by G. Hendrie in *Electronics*, Vol. 56, No. 2, Jan. 27, 1983, at pages 103-105; and J. Kavanagh in *Management Review(GB)*, September 1984 at pages 22-23. In the Hendrie article, a digital data recording and playback apparatus is disclosed which includes two data transmission channels for recording in duplicate a stream of data bits on separate tracks of a magnetic tape, each recorded bit stream being potentially influenced by a pattern of statistically distributed recording surface defects. During playback, error detection and correction circuitry for each channel provides an alarm signal synchronized with each uncorrected error condition in the corresponding stream of playback bits. A control circuit, responsive to the alarm signals from each channel, serves to interleave error-free bits from one channel to the exclusion of error bits from the other channel, to provide a single continuous stream of relatively error-free bits corresponding to the recorded signal. In the Kavanagh article, a tandem computer system is discussed which comprises two or more processors connected together by a duplicate link so that the processors can share workloads and peripherals and back each other up to produce a fault-tolerant computer system.

Such duplication, however, only protects against the destruction of data when one of the redundant disk systems fail, but does not protect the data when the redundant disk controllers write the data into different sections of the mirrored disks because of a problem with one of the disk controllers. With such error, it is almost impossible to tell which disk is correct without searching both disks in a time consuming operation.

The problem remaining in the prior art is to provide a technique which: (1) will detect that information stored in a storage location is not the same as that information stored in a redundant storage location; and (2) can then easily determine which of the redundant storage locations contains the correct data.

SUMMARY OF THE INVENTION

The foregoing problem in the prior art has been solved in accordance with the present invention which relates to a technique for information protection on one or more fault-tolerant information storage devices, and for detecting which of the redundant stored information in related storage locations of the information storage device(s) is correct in a fast and simple manner when the information in both redundant storage locations is not the same. More particularly, as each section of information to be stored is received, a separate monotonically increasing number is added to each section of information just prior to that information being stored in the redundant storage locations. Therefore, when the information does not match during the subsequent accessing of the redundant storage locations on the redundant storage device(s), an error is determined to have occurred in the redundant storage location including the lower monotonically increasing number, since such information had to be stored prior in time to the information stored with the higher monotonically increasing number, and the correct information is in the redundant storage location containing the higher monotonically increasing number.

Other and further aspects of the present invention will become apparent during the course of the following description and by reference to the accompanying drawings.

BRIEF DESCRIPTION OF THE DRAWINGS

FIG. 2 is a diagram of an exemplary format of information to be stored in the mirrored disks of FIG. 1;

FIG. 3 is an illustration of predetermined storage locations on disks 1 and 2 of FIG. 1; and FIG. 4 is an illustration of the predetermined storage locations of FIG. 2 after predetermined information has been stored therein and how a correct information entry can be determined.

DETAILED DESCRIPTION

Figure 1:
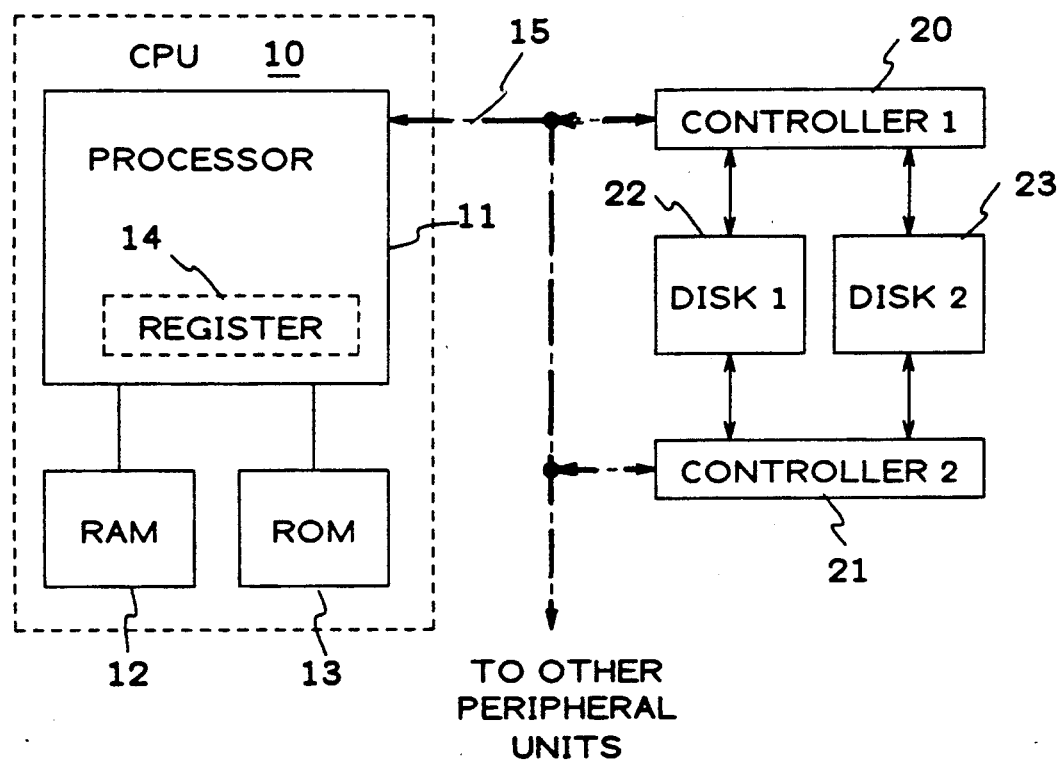
FIG. 1 is a block diagram of an exemplary processing section of an exemplary computer system for practicing the present invention.

The following description of the preferred embodiment is directed to storage of data on redundant computer disk units. However, it is to be understood that such description is not for limitation purposes and that the present invention can be applied to the storage of any form of information on redundant media or one or more storage devices, where a same storage device can be used to store the same information in two or more redundant locations thereon.

FIG. 1 is a block diagram of a pertinent portion of an exemplary processing section of a computing system which includes a Central Processing Unit (CPU) 10 comprising a processor 11, a Read Only Memory (ROM) 13 for storing the main program for processor 11, and a Random Access Memory (RAM) 12 which includes a scratchpad memory. Processor 11 is shown as including a Register 14, shown by dashed lines, which will be used for exemplary purposes in hereinafter describing the present inventive fault tolerant technique. While only one CPU is shown, it is to be understood that CPU 10 can be duplicated and run in synchronism with the other CPU as is well known in the art for ensuring that an equipment failure in a CPU will not disable the entire computer system. However, for purposes of simplicity, the following description will be based on an exemplary computer system that has only one CPU 10. CPU 10 is shown as being connected to peripheral units by a bus 15, of which only a first disk controller 20, and a second disk controller 21 are shown. Disk controllers 20 and 21 are redundant controller that operate in concert with each other to normally coordinate the write or read of data to or from a same relative storage location or sector on a first disk 22 and a second disk 23, respectively, as is well known in the art. It is to be understood that when a single storage device or disk is used for fault-tolerant information protection, the information would be stored in sequence in two "relative" or redundant storage locations on the same storage device or disk. Additionally, it is to be understood that with mirrored disks the redundant storage locations on the disk can be: (1) the exact same storage location when perfectly mirrored; or (2) different, but "relative" or offset, storage locations on the disks. As is also known in the art, when one of the redundant disk controllers 20 or 21 become disabled, the other disk controller can simultaneously or sequentially write data onto the first and second disks 22 and 23 to maintain the mirrored data, or just read from one or both of the disks, until the disabled controller is repaired.

The term "mirrored disks" indicates that each of disk 22 and 23 normally stores the same data in the same relative storage location or sector of each disk for redundancy purposes. Fault-tolerant disk systems use redundancy of data storage to protect data in case of equipment failure. In addition, most fault-tolerant equipment vendors store the address, identifier, or number, of the sector in which the data is to be stored along with the actual data to be stored in that sector as a redundancy check, but this does not cover all possibilities for detecting errors of storage as will be shown in the following description. It will be assumed hereinafter that (a) the data address, or sector number, and (b) the actual data to be stored are encoded with a circular redundancy code, or any suitable error correcting code, before being sent by processor 11 over bus 15 to controllers 20 and 21. To enable the swift and easy detection of faulty data in a corresponding sector of one of disks 22 or 23, a monotonically increasing number is added to the sector address and data information before such sector address and data information is simultaneously or sequentially stored in mirrored disks 22 and 23 via controllers 20 and 21. A monotonically increasing number is defined herein as a sequence of numbers such that the n+1 number is always greater than the $n^{th}$ number. For example, the cardinal numbers 1, 2, 3, etc., can be denoted as a time and date number as, for example, Nov. 15, 1989, at 2:00.00 p.m. which can be written as 8911151400.00 and used as a monotonically increasing number, where the next monotonically increasing number in the sequence might be 8911151400.01 for the next second of time and used if information is to be stored during that second in time. Such monotonically increasing number may be added, for example, by processor 11 before transmitting the sector number and data over bus 15 to controllers 20 and 21. Processor 11 can, for example, obtain such monotonically increasing number from a register 14 which is incremented with every data transmission being sent to controllers 20 and 21 for simultaneous storage in mirrored disks 22 and 23 or by any other suitable means.

FIG. 2 illustrates an exemplary arrangement of a packet of data that is stored in duplicate by controllers 20 and 21 on mirrored disks 22 and 23. The format used for such packet of data includes a disk sector number section 30 including a predetermined number of K bits indicating the sector address or relative storage location identifier in which the data is to be stored; a section 31 comprising a predetermined number of L bits for use indicating the monotonically increasing number; and a section 32 comprising a predetermined number of M bits for sending the actual data bits. It is to be understood that the format shown is only for purposes of explanation and not for purposes of limitation in that any other suitable arrangement of such sections would fall within the spirit and scope of the present invention. However, the format shown in FIG. 2 will be assumed for the transmission and storage of data in the discussion which follows.

FIG. 3 illustrates five exemplary disk sectors, numbered 1-5, on each of disks 22 and 23 which are originally assumed empty. In a first illustrative step, data designated D1 is generated or obtained from a peripheral device by processor 11 for storage in mirrored disks 22 and 23. Processor 11 determines that data D1 is to be stored in sector 2; adds the sector number "2" in section 30 of the packet; obtains and adds the next monotonically increasing number, here determined as number 100, in section 31 of the packet; adds data D1 into section 32 of the data packet; and then transmits the packet over bus 15 to controllers 20 and 21. Controllers 20 and 21 receive this packet, use the sector address from section 30 of the data packet to access sector 2 in each of mirrored disks 22 and 23, and store the data packet therein. As shown in FIG. 3, at the conclusion of this step, when no error has taken place, sector 2 of each of disks 22 and 23 is found to store the sector number (2), the monotonically increasing number (100) and the data (D1) found in the received data packet. For an exemplary next step, it will be assumed that processor 11 receives second data D2 that it determines should be stored in sector 3 of mirrored disks 22 and 23. Therefore, processor 11 adds the sector number 3 in section 30 of the data packet; the next monotonically increasing number 101 in section 31 of the data packet; the data D2 in section 32 of the data packet; and transmits such data packet to controllers 20 and 21 via bus 15. With no writing error, controllers 20 and 21 will write such data packet information into sector 3 of each of mirrored disks 22 and 23, as shown in FIG. 3.

FIG. 4 illustrates the case of a writing error by one of controllers 20 and 21 at a period of time after the above two steps, shown in FIG. 3, have been completed. For example, it will be assumed that processor 11 receives or generates data designated D3 that it determines should be stored in sector 3 of mirrored disks 22 and 23. Therefore, processor 11 forms the data packet with the designated sector number (3) placed in section 30 of the packet; the next monotonically increasing number, e.g., 113, placed in section 31 of the data packet; the data D3 in section 32 of the data packet; and transmits such data packet to controllers 20 and 21 via bus 15. It is now assumed that controller 20 correctly stores this data packet in sector 3 of disk 22, thereby overwriting the previously stored D2 data packet, while controller 21 erroneously write this data packet into sector 2 of disk 23, thereby overwriting the previously stored D1 data packet.

When processor 11 thereafter determines that the data in sector 2 is to be read, it send a "read" instruction to controllers 20 and 21 which access sector 2 on mirrored disks 22 and 23, respectively, and initially, for example, compare the data sections 32 to find that the D1 and D3 data do not match and determine that an error has occurred. Had no error in the data matching occurred, one of the controllers 20 and 21 would have then sent the data to processor 11. However, once such error has been found, controllers 20 and 21 would then compare the sector address stored in sector 2 of disks 22 and 23. In accordance with the example shown in FIG. 4, controller 20 would determine that the sector address in sector 2 of disk 22 is correct, and controller 21 would find that the sector address in sector 2 of disk 23 was incorrect, thereby indicating that the data packet stored in sector 2 of disk 22 was the correct data. In practice, having made such determination of an error in sector 2 of disk 23, either controller 20 or 21 could overwrite sector 2 of disk 23 with the packet of data presently stored in sector 2 of disk 22 so that both disks now match in sector 2 or some other appropriate error-recovery procedure.

When processor 11 thereafter determines that the data in sector 3 is to be read, controllers 20 and 21 receive the "read" instruction from processor 11 and access sector 3 on mirrored disks 22 and 23, respectively. When controllers 20 and 21 first compare the data sections 32 in both stored data packets, they will find that the D3 and D2 data do not match. Controllers 20 and 21 then compare the sector address stored in packet section 30 in sector 3 of both disks 22 and 23 and find that they match. In accordance with the prior art, this is as far as the error detection could proceed since, at most, only the sector address in section 30 and the data in section 32 were stored. Therefore, with prior art systems it would be impossible to tell which of the mirrored disks 22 and 23 carried the correct data in sector 3 without performing an interrupt of the computer system and doing a search of both disks 22 and 23 in a time consuming operation. However, in accordance with the present invention, controllers 20 and 21 can easily determine which of the two data packets stored in sector 3 of disks 22 and 23 is the correct data by next comparing the monotonically increasing number stored in section 31 of the data packet in sector 3 of disks 22 and 23. When performing this function, it can be seen from FIG. 4 that the data packet in sector 3 of disk 22 has the correct data, since its monotonically increasing number is 113 while the monotonically increasing number stored in sector 3 of disk 23 is only 101, where the higher number indicates a most recent writing of a data packet into a disk sector while the lower number concurrently indicates that the data packet contains old and unwanted data. It is to be understood that the function of controllers 20 and 21 performing the comparisons is for purposes of illustration and not for purposes of limitation, and that such comparisons could be performed by any device or medium within the system as, for example, processors 11 and still be within the spirit and scope of the present invention.

In conclusion, a preferred sequence for reading data from corresponding sectors of mirrored disks would be to first compare the data in section 32 of the corresponding sectors to see if the data in those sectors matched, and to send the data to processor 11 if the data matched. If the data in the corresponding sectors did not match, then the stored sector address numbers in section 30 of the stored data packets would be compared, and if they did not match, then the data in the packet with the correct sector address number would be sent to processor 11. However, if the sector addresses matched, then the monotonically increasing number stored in section 31 of the stored data packets would be compared and the data packet with the higher number would be sent to processor 11 since this is the most recent data to be stored in that sector. It is to be understood that these steps could be performed in a different sequence and still provide the ultimate result described above, and thereby still fall within the spirit and scope of the present invention.

I claim:

1. A method of protecting information on fault-tolerant redundant information storage devices, the method comprising the steps of:
   (a) transmitting information packets in sequence to redundant storage device controllers for the concurrent storage of each packet in a predetermined relative storage location of the redundant information storage devices, each sequential information packet comprising (i) a storage location identifier disposed in a first section of the information packet indicating the destined storage location on the redundant infomation storage devices for the information packet, (ii) information disposed in a second section of the information packet for storage in the storage location designated in the first section, and (iii) a unique number disposed in a third section of the information packet, in which said number is a separate, always monotonically increasing number that is provided to each sequential packet that is transmitted to the storage device controllers; and
   (b1) the redundant storage device controllers using the storage location identifier in the first section of each received information packet for accessing a storage location in each of the redundant information storage devices, and (b2) storing the information packet, including the first, second, and third sections, in the accessed storage locations of the redundant information storage devices.

2. A method of protecting information on fault-tolerant redundant information storage devices, the method comprising the steps of:
   (a) transmitting information packets in sequence to redundant storage device controllers for the concurrent storage of each packet in a predetermined relative storage location of the redundant information storage devices, each sequential information packet comprising (i) a storage location identifier disposed in a first section of the information packet indicating the destined storage location on the redundant information storage devices for the information packet, (ii) information disposed in a second section of the information packet for storage in the storage location designated in the first section, and (iii) a unique number disposed in a third section of the information packet which is a separate, always monotonically increasing number provided to each sequential packet that is transmitted to the storage device controllers; and
   (b1) the redundant storage device controllers using the storage location identifier in the first section of each received information packet for accessing a storage location in each of the redundant information storage devices, and (b2) storing the information packet, including the first, second, and third sections, in the accessed storage locations of the redundant information storage devices, and wherein
   (c) when reading information packets from relative storage locations of the redundant information storage devices, and if (c1) a comparison of the information in the second sections is found not to match, and (c2) a comparison of the storage location identifier in the first section is found to match; then (c3) comparing the information in the third sections to determine which information packet in the relative storage locations of the redundant information storage devices has the higher number in the third section; and (d) transmitting the information packet determined to include the higher number in step (c3) to and end user circuit requesting such packet.

3. The method according to claim 2 wherein the method comprises the further steps of:

(e1) prior to performing steps (c), accessing a predetermined relative storage location of the redundant information storage devices, and (e2) comparing the information stored in the second section of the information packet stored in the relative storage locations for determining if such information in the relative storage locations matches, and (e3) transmitting either one of the information packets to a requesting end user device if such information matches for concluding a redundant information storage device reading process, or proceeding to steps (f1) and (f2) if such information does not match; and (f1) comparing the storage location identifier stored in the first section of the accessed information packets and (f2) transmitting the information packet from the storage location of the redundant information storage device which has the correct storage location identifier when the storage location identifiers in the compared information packets do not match, or proceeding to steps (c) when the storage location identifiers match.

4. A method of providing information protection on fault-tolerant redundant information storage devices, where each information packet that is supplied by a requesting end user device is stored on the redundant information storage devices includes a first section comprising a storage location identifier on an information storage device where the information packet is to be stored, a second section comprising information to be stored in the storage location identifier indicated in the first section, and a third section including a number which is a separate, always monotonically increasing number that is applied to each sequential packet that is stored on the redundant information storage devices, the method comprising the steps of:

(a1) when accessing relative storage locations of the redundant information storage devices to perform a read operation, (a2) comparing the information in the second section of each stored information packet, and (a3) transmitting the information from one of the compared information packets to the requesting end user device when the information comparison determines that the information in the relative storage locations match, (b1) comparing the storage location identifiers in each first section of the stored information packet in each of the accessed storage locations of the redundant information storage devices when the information in the compared storage locations in step (a1) do not match, and (b2) if the storage location identifiers do not match, then transmitting to the requesting end user device the information from the information packet whose associated storage location identifier matches the identifier of the associated accessed storage location ; and (c1) comparing the number stored in the third section of the information packets compared in steps (a) and (b) when both the information comparison in steps (a) is found not to match, and the storage location identifiers in steps (b) are found to match, and (c2) transmitting the information from the information packet found to have the highest number in the third section of the compared information packets.

5. A fault-tolerant system comprising:

plurality of redundant information storage devices, each device including a plurality of storage locations for storing separate packets of information; and plurality of information device controllers arranged to operate in cooperation with each other to perform corresponding operations, each information device controller comprising, means for accessing a separate one of the plurality of redundant information storage devices when none of the storage devices or controllers are disabled, and for writing an information packet into a predetermined storage location of the accessed storage device, each information packet including (i) a first section comprising a storage location identifier corresponding to the storage location on the redundant information storage device where the information packet is to be stored, (ii) a second section comprising the information to be stored in the storage location indicated by the first section, and (iii) a third section comprising a number which is a separate always monotonically increasing number that is applied to each sequential packet being stored on the plurality of redundant information storage devices.

6. A fault-tolerant system comprising:

redundant information storage devices, each device including a plurality of storage locations for storing separate packets of information supplied by a requesting end user device; and information device controllers arranged to operate in cooperation with each other to perform corresponding operations, each information device controller comprising, means for accessing a separate one of the redundant information storage devices when none of the storage devices or controllers are disabled, and for writing an information packet into a predetermined storage location of the accessed storage device, each information packet including (i) a first section comprising a storage location identifier corresponding to the storage location on the redundant information storage device where the information packet is to be stored, (ii) a second section comprising the information to be stored in the storage location indicated by the first section, and (iii) a third section comprising a number which is a separate always monotonically increasing number that is applied to each sequential packet being stored on the one or more redundant information storage devices, and wherein each of the accessing means is also arranged for reading an information packet from a predetermined storage location of the accessed storage device; and wherein the system further comprises:

comparison means, responsive to the accessing means reading an information packet from a predetermined storage location on the associated storage device, for (i) comparing the information stored in the second section of the accessed information packet with information stored in the second section of accessed information packets of relative storage locations of the other storage devices, (ii)

determining if the information from the relative accessed storage locations match, and for (iii) transmitting such information to the requesting end user device when the information is found to match to end the packet reading step, (iv) comparing the storage location identifiers in the first section of the stored information packet in each of the accessed storage locations of the redundant information storage devices when the accessing means has determined that such information from accessed relative storage locations of the accessed storage devices do not match, and for then (v) transmitting to the end user device the information packet whose associated location identifier matches the identifier of the associated accessed storage location when the compared storage location identifiers do not match to end the packet reading step, and (vi) comparing the number in the third section of the accessed information packet with the number in the third section of each of the relative storage locations in the other accessed storage locations when (a) an information match has not been found and (b) the storage location identifiers have been found to match, for transmitting the information packet having the highest number in the third section to the end user device to conclude the packet reading step.

* * * * *